US008279679B2

(12) United States Patent
Kamigaichi et al.

(10) Patent No.: US 8,279,679 B2
(45) Date of Patent: Oct. 2, 2012

(54) NON-VOLATILE SEMICONDUCTOR MEMORY DEVICE, METHOD OF READING DATA THEREFROM, AND SEMICONDUCTOR DEVICE

(75) Inventors: Takeshi Kamigaichi, Yokohama (JP); Kenji Sawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 69 days.

(21) Appl. No.: 12/979,796

(22) Filed: Dec. 28, 2010

(65) Prior Publication Data

US 2011/0157997 A1    Jun. 30, 2011

(30) Foreign Application Priority Data

Dec. 28, 2009    (JP) ............................... P2009-296797

(51) Int. Cl.
*G11C 16/06* (2006.01)
(52) U.S. Cl. .................................................. 365/185.22
(58) Field of Classification Search .............. 365/185.22
See application file for complete search history.

(56) References Cited

U.S. PATENT DOCUMENTS

| | | | |
|---|---|---|---|
| 7,671,475 B2 | 3/2010 | Kamigaichi et al. | |
| 7,782,673 B2 | 8/2010 | Maejima et al. | |
| 7,821,827 B2 * | 10/2010 | Kim | 365/185.03 |
| 2009/0244969 A1 | 10/2009 | Maejima | |
| 2010/0067297 A1 * | 3/2010 | Chae et al. | 365/185.11 |
| 2010/0103736 A1 | 4/2010 | Kamigaichi et al. | |

FOREIGN PATENT DOCUMENTS

JP    2009-146556    7/2009

OTHER PUBLICATIONS

U.S. Appl. No. 13/335,095, filed Dec. 22, 2011, Futatsuyama, et al.
U.S. Appl. No. 13/237,291, filed Sep. 20, 2011, Kamigaichi, et al.
U.S. Appl. No. 12/886,847, filed Sep. 21, 2010, Kamigaichi.

* cited by examiner

*Primary Examiner* — Hoai V Ho
*Assistant Examiner* — Pablo Huerta
(74) *Attorney, Agent, or Firm* — Oblon, Spivak, McClelland, Maier & Neustadt, L.L.P.

(57) ABSTRACT

A control circuit is configured to perform, in a write operation to a memory cell and a verify operation for verifying a threshold voltage of the memory cell, a voltage control to provide the memory cell with threshold voltage distributions. The circuit is configured to apply, in a read operation from the memory cell, to a selected memory cell a read voltage between the lower and upper limits of the threshold voltage distributions, and apply to an unselected memory cell a first read-pass voltage higher than the upper limit of a first threshold voltage distribution that is the maximum distribution of the threshold voltage distributions. The circuit is configured to apply, at least during a verify operation in a first write operation conducted before a second write operation that completes writing to the first threshold voltage distribution, a second read-pass voltage lower than the first read-pass voltage to the unselected memory cell, and apply to the semiconductor layer and the source-line a positive voltage.

18 Claims, 10 Drawing Sheets

Lower Page PRG

Upper Page PRG (Negative Sense Scheme)

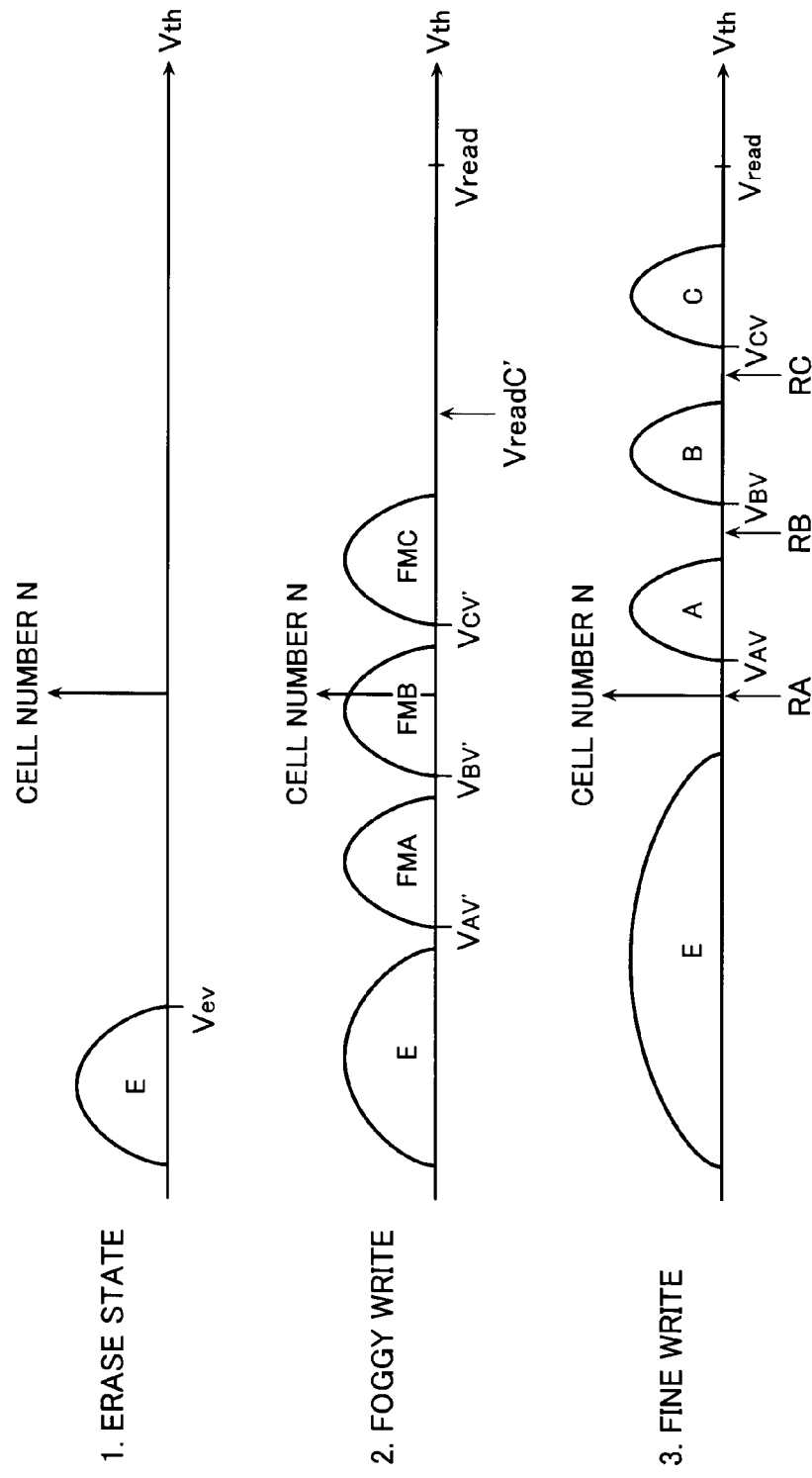

NON-VOLATILE SEMICONDUCTOR MEMORY DEVICE, METHOD OF READING DATA THEREFROM, AND SEMICONDUCTOR DEVICE

CROSS-REFERENCE TO RELATED APPLICATIONS

This application is based upon and claims the benefit of priority from the prior Japanese Patent Application No. 2009-296797, filed on Dec. 28, 2009, the entire contents of which are incorporated herein by reference.

BACKGROUND

Field

The embodiments described in the specification relate to an electrically rewritable non-volatile semiconductor memory device, and more particularly, to a non-volatile semiconductor memory device adapted to be able to perform a multi-level storage scheme for providing two bits or more data to one memory cell, a method of reading data therefrom, and a semiconductor device.

In a NAND cell flash memory, as the memory cell becomes more compact, the lower limit voltage of the threshold voltage distribution after the data erase operation becomes increasingly a lower value (negative large value). In this case, the data write operation from the erase state having the low voltage of threshold voltage distribution may provide a negative voltage rather than a positive voltage after-writing threshold voltage distribution.

It has therefore been proposed that the read voltage Vcg applied to the selected memory cell in the read operation is also set to a negative voltage. Provision of a negative voltage as the read voltage Vcg needs, however, a special voltage generation circuit, which may increase the circuit area and power consumption.

A NAND cell flash memory is proposed that uses a scheme in which the source-line and the well (a semiconductor layer in which the memory cell is formed) is applied with a positive voltage, thereby eliminating the necessity of applying the negative read voltage Vcg to the control gate of the selected memory cell (the scheme may hereafter be referred to as "negative sense scheme"). According to the negative sense scheme, there is no need to provide a voltage generation circuit for generating a negative voltage at the control gate (word-line), thereby suppressing the increase in the circuit area.

In this method, however, if the threshold voltage distribution shifts largely in the negative direction, the source-line and the well should be applied with a higher voltage in the read operation and the verify read operation (here after may be said "verify operation"). If the source-line and well should be applied with a voltage higher than, for example, the power supply voltage, it will accordingly increase the sizes of the peripheral circuits such as the source-line driver and the well driver, thereby increasing the circuit area and the power consumption. Further, a problem will arise that it will take a longer time to charge the source-line and the well, thereby needing more amount of time for the read operation and the verify operation.

BRIEF DESCRIPTION OF THE DRAWINGS

FIG. 10A shows an operation according to a second embodiment.

DETAILED DESCRIPTION

Figure 1:
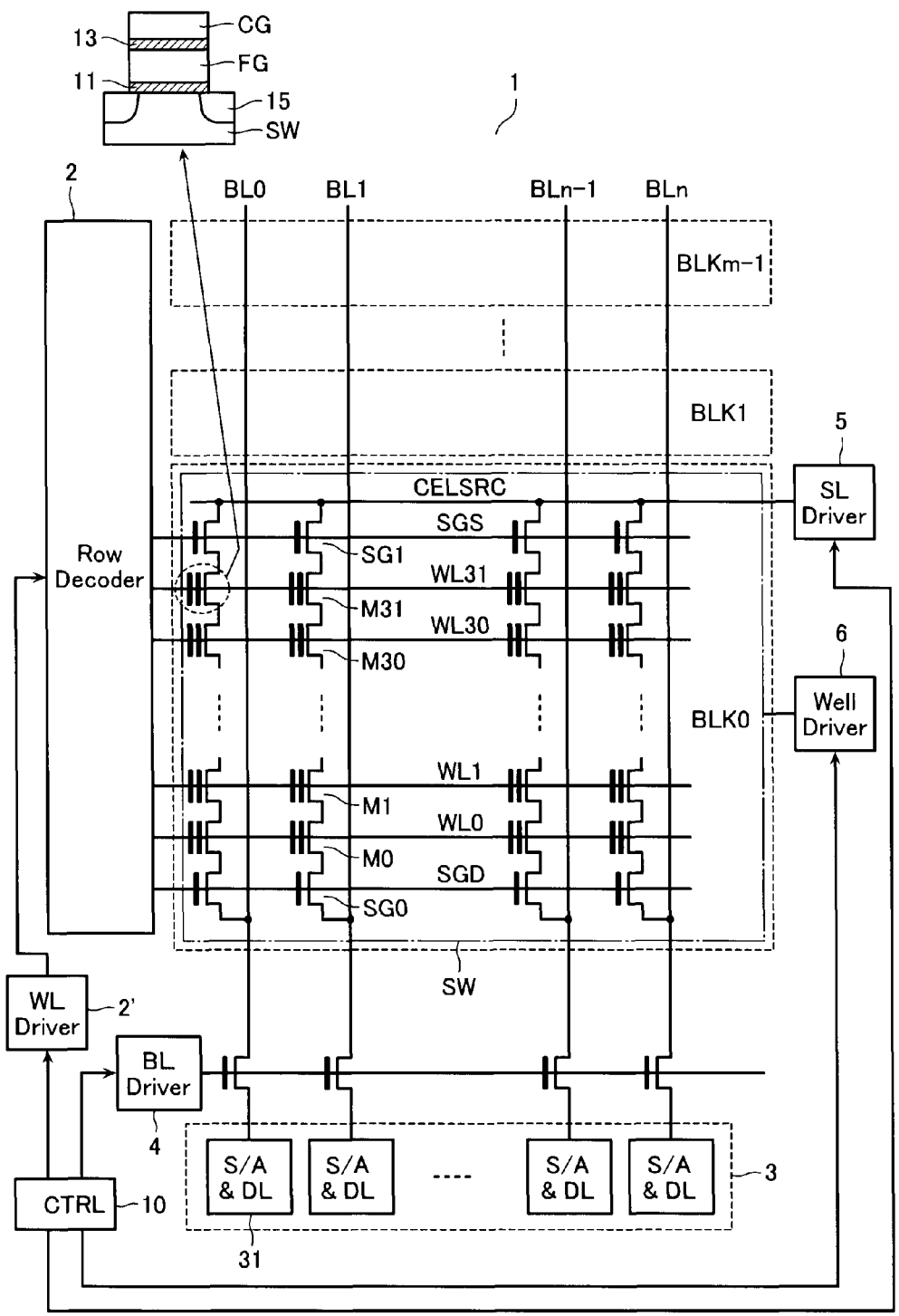
FIG. 1 is a circuit diagram illustrating a memory core configuration of a NAND cell flash memory according to a first embodiment.

A non-volatile semiconductor memory device according to an aspect of the invention includes a semiconductor layer, a memory cell array, a bit-line, a source-line, and a control circuit. The memory cell array includes a memory string, the memory string including a plurality of memory cells connected in series. The bit-line is electrically connected to a first end of the memory string. The source-line is electrically connected to a second end of the memory string. The control circuit is configured to control voltages applied to the semiconductor layer, control gates of the memory cells, the bit-line, and the source-line. The control circuit is configured to perform, in a write operation to a memory cell and a verify operation for verifying a threshold voltage of the memory cell, a voltage control to provide the memory cell with a plurality of threshold voltage distributions. The control circuit is configured to apply, in a read operation from the memory cell, to a selected memory cell a read voltage between the lower and upper limits of a plurality of threshold voltage distributions, and apply to an unselected memory cell a first read-pass voltage higher than the upper limit of a first threshold voltage distribution, the first threshold voltage distribution being the maximum distribution of the threshold voltage distributions. The control circuit is configured to apply, at least during a verify operation in a first write operation conducted before a second write operation that completes writing to the first threshold voltage distribution, a second read-pass voltage lower than the first read-pass voltage to the unselected memory cell, and apply to the semiconductor layer and the source-line a positive voltage.

A non-volatile semiconductor memory device for use in a method of reading data according to an aspect of the invention includes a memory cell array. The memory cell array includes a semiconductor layer, a memory string, a bit-line, and a source-line. The memory string includes a plurality of memory cells connected in series. The bit-line is electrically connected to a first end of the memory string. The source-line is electrically connected to a second end of the memory string. The method of reading data comprises, in a read operation from the memory cell, applying to a selected memory cell a read voltage between the lower and upper limits of the threshold voltage distributions, and applying to an unselected memory cell a first read-pass voltage higher than the upper limit of a first threshold voltage distribution, the first threshold voltage distribution being the maximum distribution of the threshold voltage distributions. The method of reading data comprises, at least during a verify operation in a first write operation conducted before a second write operation that completes writing to the first threshold voltage distribution, applying a second read-pass voltage lower than the first read-pass voltage to the unselected memory cell, and applying to the semiconductor layer and the source-line a positive voltage.

A semiconductor device according to an aspect of the invention includes a control circuit for controlling a voltage applied to a memory cell array. The memory cell array includes a semiconductor layer, a memory string, a bit-line, and a source-line. The memory string includes a plurality of memory cells connected in series. The bit-line is electrically connected to a first end of the memory string. The source-line is electrically connected to a second end of the memory string. The control circuit is configured to perform, in a first write operation to a memory cell, a first verify operation for verifying a threshold voltage of the memory cell after the first write operation, a second write operation to the memory cell, and a second verify operation for verifying threshold voltage of the memory cell after the second write operation, a voltage control to provide the memory cell with a plurality of threshold voltage distributions. The control circuit is configured to apply, in the second verify operation, to a selected memory cell a read voltage between the lower and upper limits of the threshold voltage distributions, and apply to an unselected memory cell a first read-pass voltage higher than the upper limit of a first threshold voltage distribution, the first threshold voltage distribution being the maximum distribution of the threshold voltage distributions. The control circuit is configured to apply, in the first verify operation after the first write operation conducted before the second write operation, a second read-pass voltage lower than the first read-pass voltage to the unselected memory cell, and applies to the semiconductor layer and the source-line a positive voltage.

Referring now to the drawings, embodiments of the present invention will be described in more detail.

[First Embodiment]

FIG. 1 shows a memory core configuration of a NAND cell flash memory according to a first embodiment.

A memory cell array 1 includes an array of NAND strings. Each NAND string includes a plurality (i.e., 32) of electrically rewritable non-volatile memory cells M0 to M31 connected in series. The number of memory cells in one NAND string is not limited to 32. The number may be, for example, 64 and 128. The ends of each NAND string have a drain-side select gate transistor SG0 and a source-side select gate transistor SG1 connected thereto, respectively. The select gate transistors SG0 and SG1 are rendered conductive when that NAND string is selected. The 32 memory cells M0 to M31 and the select gate transistors SG0 and SG1 together form one NAND cell unit.

The memory cells M may each be a floating-gate memory cell. The floating-gate memory cell includes a semiconductor substrate, a p-type well SW formed on the substrate, a floating gate FG (a charge storage layer) formed on the well SW via a gate-insulating film 11, and a control gate CG formed on the floating gate FG via an inter-gate insulating film 13. The memory cells M connected in series in one NAND string share a drain source diffusion layer 15. The floating gate memory cell may be replaced with a MONOS memory cell. The MONOS memory cell includes a charge storage layer including, for example, a silicon nitride film.

Each NAND cell unit connects to a bit-line BL at one end of the drain-side select gate transistor SG0. The NAND cell unit also connects to a source-line CELSRC at one end of the source-side select gate transistor SG1.

In the NAND cell unit, the control gates of the memory cells M0 to M31 connect to different word-lines WL0 to WL31, respectively. The gates of the select gate transistors SG0 and SG1 connect to select gate lines SGD and SGS, respectively, which are in parallel with the word-lines WL0 to WL31.

To selectively drive the word-line WL and the select gate lines SGD and SGS, a row decoder 2 and a word-line driver 2' are provided. Each bit-line BL connects to a sense amplifier/data latch 31 in a sense amplifier circuit 3. The bit-line BL is charged to a predetermined voltage (for example 1 V) in a read operation by a precharge circuit (not-shown) included in the sense amplifier/data latch 31. Between the bit-line BL and the sense amplifier/data latch 31 is connected a clamp transistor. The gate voltage of the clamp transistor is controlled by a bit-line driver 4.

Here is shown the bit-lines BL and the respective sense amplifier data latches 31 that are connected in a one-to-one relationship. In this case, one or more memory cells selected by one word-line provide one page that is simultaneously written/read. Note, however, that a scheme may be used where, for example, adjacent even-numbered and odd-numbered bit-lines may share one sense amplifier and data latch. In this case, half the memory cells selected by one word-line provide a unit (one page) that is simultaneously written/read.

A set of NAND cell units sharing a word-line provides a block as a unit of data erase. As shown, in the bit-line BL direction, a plurality of blocks BLK, BLK1, . . . , BLKm−1 are arranged.

As a circuit to control the potential of the source-line SL and the well SW, a source-line driver 5 and a well driver 6 are provided, respectively. The source-line driver 5 and the well driver 6 increase, when performing the above negative sense scheme, the voltages of the source-line SL and the well SW to a voltage Vsrc (>0) and a voltage Vwell (Vwell>0, Vsrc≧Vwell), respectively. To avoid application of any substrate bias, the voltage Vwell is adjusted to be equal to or less than the voltage Vsrc. A control circuit 10 controls the drivers 2', 4, 5, and 6 to control the voltages applied to the word-line WL, bit-line BL, source-line SL, and well SW.

Figure 2:
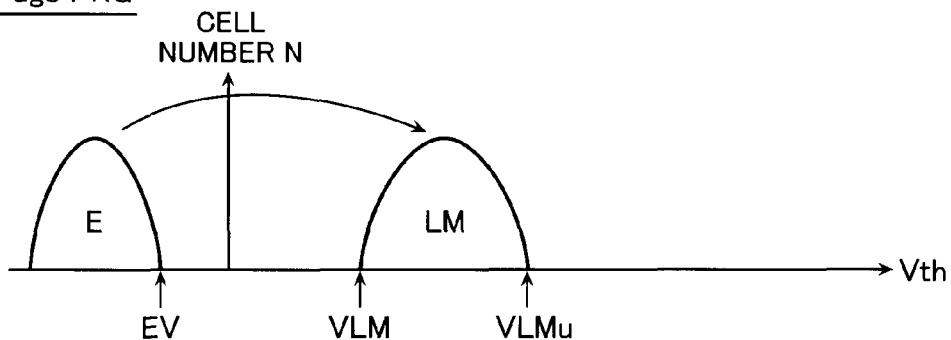
FIG. 2 is an example of a data write method where a four-level data storage scheme is performed in a NAND cell flash memory according to the first embodiment.
Figure 2:
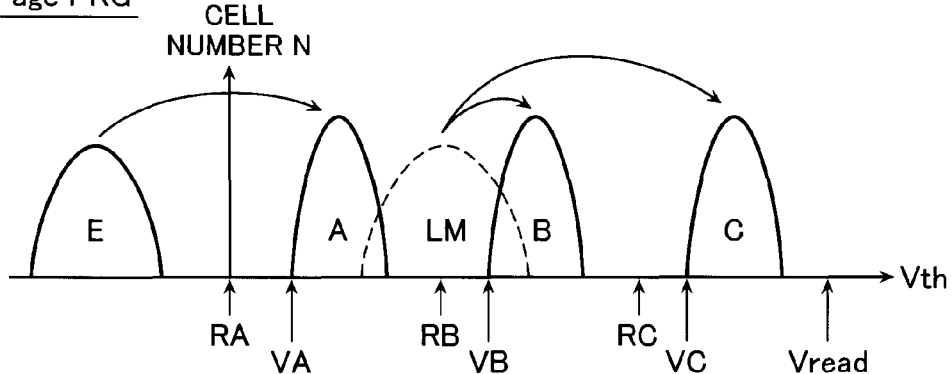
Figure 3:
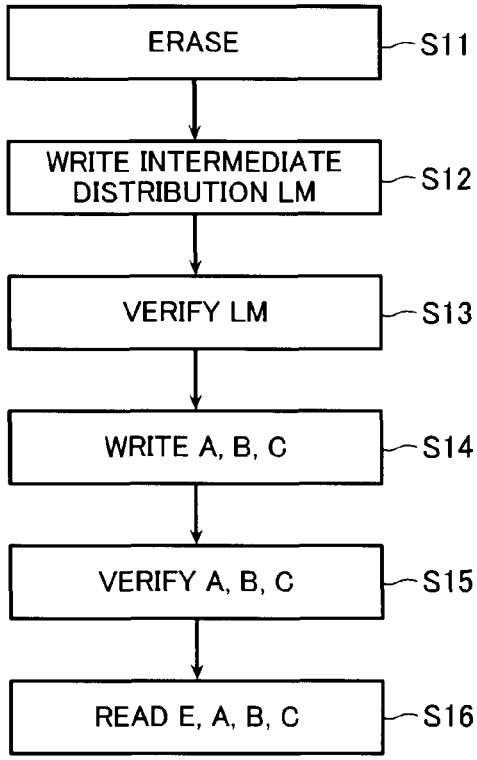
FIG. 3 is a flowchart of a procedure for performing the write method in FIG. 2.

FIG. 2 illustrates an example of the data write method in a four-level data storage scheme in the NAND cell flash memory according to this embodiment. FIG. 3 is a flowchart of a procedure for performing the write method. The four-level data is defined by, for example, a negative threshold voltage distribution (an erase distribution) E at the lowest voltage level and threshold voltage distributions A, B, and C at voltage levels higher than the negative voltage distribution.

The four-level data is written by first setting all memory cells in a selected block to the lowest negative threshold voltage distribution E (data erase: step S11 in FIG. 3). The data erase is performed by applying a positive erase voltage Vera from the well driver 6 to the well SW in which the memory cell array 1 is formed and setting all word-lines in the selected block to 0 V, thereby discharging electrons of the floating gates of all memory cells M.

Then, some of the cells at the threshold voltage distribution E is written to an intermediate distribution LM to perform a lower page program (step S12 in FIG. 3). A verify voltage is then set to a voltage VLM (the voltage VLM is applied across the gate and source of the selected memory cell M) to perform a verify operation that verifies the completion of the writing of the intermediate distribution LM (step S13).

An upper page program is then performed to increase the threshold voltage from the threshold voltage distribution E to A, and from the intermediate distribution LM to the threshold voltage distributions B and C. A verify operation is then performed by using, as the verify voltage, a voltage VA, VB, or VC (steps S14 and S15). Thus, after the writing of all threshold voltage distributions E and A to C is complete, as necessary, the read operation is performed (step S16). In the read operation, the read voltage applied across the gate and source of the selected memory cell M is set to read voltages RA, RB, and RC. The read voltages RA, RB, and RC each fall between the upper and lower limits of two of the threshold voltage distributions E and A to C, respectively. At the same time, the unselected memory cells are applied with a read-pass voltage Vread sufficiently higher than the upper limit of the threshold voltage distribution C.

The above data write operation includes providing the selected word-line with a write voltage VPGM, the unselected word-line with a write pass voltage Vpass, and the bit-line with the ground voltage Vss (for the "0" write that increases the threshold voltage) or the power supply voltage Vdd (for the write inhibit that does not increase the threshold voltage), thereby selectively injecting electrons into the floating gate of the memory cell.

Specifically, in the "0" write, the ground voltage Vss provided to the bit-line BL is transferred to the channel of the NAND cell unit, and when the write voltage VPGM is provided, electrons are injected from the channel to the floating gate via a tunnel current. In the "1" write (write inhibit), the NAND cell channel is charged to Vdd−Vt (Vt is the threshold voltage of the drain-side select gate transistor SG0) and is floated, and when the write voltage VPGM is provided, the cell channel is boosted via capacitive coupling, thereby experiencing no electron injection. Note that the data write is usually performed in a step-up write scheme in which the write voltage is gradually increased for each write cycle (the write operation and the verify operation).

In the lower page program (writing of the intermediate distribution LM), to being the lower limit of the threshold voltage of the intermediate distribution LM to a predetermined voltage (the verify voltage VLM) or more, the write state is verified (verify operation). Specifically, in the verify read operation of providing the verify voltage VLM across the control gate (the selected word-line) of the selected memory cell, it is determined as a write failure (fail) if the selected memory cell is rendered conductive, and as a write successful (pass) if the cell is not rendered conductive. Likewise, in the upper page write, the verify voltages VA, VB, and VC are used for the verify operation of the respective data states A, B, and C.

Figure 4:
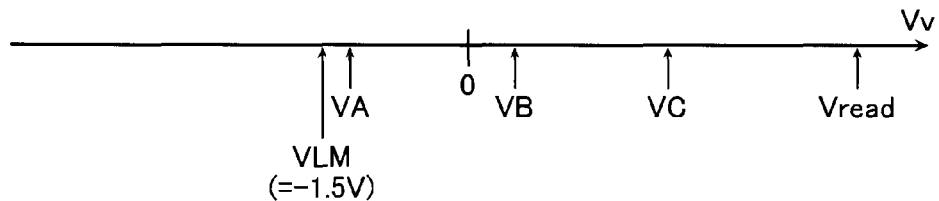
FIG. 4 shows negative verify voltages VLM and VA for an intermediate distribution LM and a threshold voltage distribution A, respectively.

In the NAND cell flash memory, however, as the memory cell becomes more shrinking, the lower limit voltage of the threshold voltage distribution after the data erase operation becomes increasingly a lower value (negative large value). In this case, the data write operation from the erase-state having the low voltage of threshold voltage distribution may provide a negative voltage rather than a positive voltage after-writing threshold voltage distribution. In this embodiment, therefore, as shown in FIG. 4, at least some of the verify voltages are set to a negative value. Here, by way of example, the verify voltages VLM and VA are set to negative values (VLM<0 and VA<0).

Figure 5:
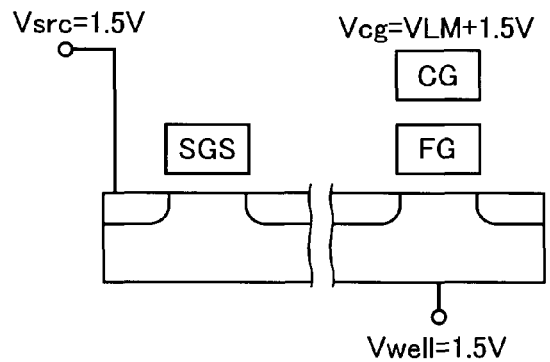
FIG. 5 shows a schematic diagram of the so-called negative sense scheme.

In this case, in the verify operation, the control gate (word-line) of the selected memory cell Mn should be provided with a negative voltage. Provision of a voltage generation circuit that may provide the control gate of the memory cell with a negative voltage will lead to an increase in the circuit area. In this embodiment, therefore, the above negative sense scheme is used. Here, by way of example, the verify voltages VLM and VA are set to negative values (VLM<0 and VA<0). In the negative sense scheme, in the read operation and the verify read operation, the voltages Vsrc and Vwell applied to the respective source-line CELSRC and the well SW are set to a positive voltage, for example, of about 1.5 V (see FIG. 5). In this case, for example, if the verify voltage VLM for the intermediate distribution LM is −1.5 V, in the verify operation of the intermediate distribution LM, the voltage Vg applied to the control gate of the selected memory cell for the verify operation of the intermediate distribution LM may be 0 V (=−1.5+1.5). If the negative sense scheme is not used in the above case (i.e., for Vsrc=Vwell=0 V), −1.5 V should be applied to the control gate of the selected memory cell for the verify operation of the intermediate distribution LM. According to the negative sense scheme, therefore, even if the verify voltage is set to a negative voltage, a negative voltage needs not be applied to the control gate of the selected memory cell. The voltage generation circuit may thus be reduced in the area.

Figure 6:
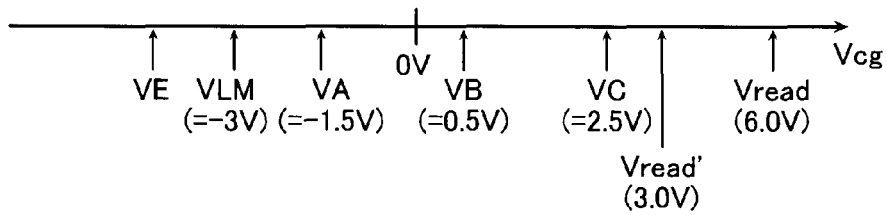
FIG. 6 shows various verify-voltage assignments when the verify voltage VLM for the intermediate distribution LM is set to a small negative value.

If the memory cell becomes even more compact, the verify voltage should be further reduced. Referring to FIG. 6, for example, the verify voltage VLM for the intermediate distribution LM may be reduced to, for example, about −3 V. Even in that case, in the read operation and the verify operation, the voltages Vsrc and Vwell applied to the respective source-line CELSRC and well SW may be set to 3 V to allow the voltage applied to the control gate of the selected memory cell in the verify operation to be 0 V.

If, however, the source-line CELSRC and well SW are provided with high voltages of, for example, 3 V, the wide area of the non-volatile semiconductor memory device makes it take a long time to charge the well. Providing a high voltage to the well SW may, therefore, adversely affect the speeding up of the write operation. Specifically, the threshold voltage distributions other than the erase distribution E may be provided with a negative lower limit, but a too small lower limit may be substantially unaccommodated in the negative sense scheme.

Figure 7:
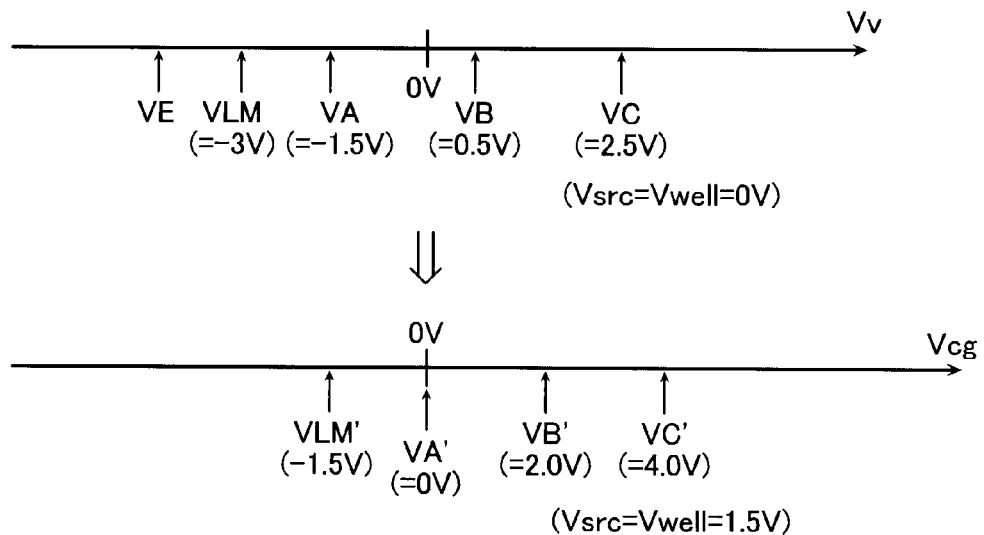
FIG. 7 shows an operation according to the first embodiment.

This embodiment, therefore, performs the negative sense scheme in which the voltages Vsrc and Vwell are set to positive voltages, but the voltages are small enough not to adversely affect the write operation. The voltages Vsrc and Vwell are limited to, for example, about 1.5 V. The absolute value (for example, 3 V) of the verify voltage VLM for the verify operation of the intermediate distribution LM is, however, larger than the absolute values (for example, 1.5 V) of the voltages Vsrc and Vwell. In this case, referring to FIG. 7, if the verify voltage VLM for the intermediate distribution LM is −3 V, the voltage VLM' applied to the control gate of the selected memory cell for the verify operation of the intermediate distribution LM should be −1.5 V (−3+1.5=−1.5 V) (note that because the threshold voltage distributions A, B, and C each have a lower limit higher than the lower limit of the intermediate distribution LM, any of the voltages VA', VB', and VC' applied to the control gate of the selected memory cell for the verify operation (FIG. 7) is not a negative voltage). In this embodiment, therefore, the following operations are performed in the verify read of the intermediate distribution LM. Thus, even in the above situation, the voltage applied to the control gate of the selected memory cell Mn for the verify operation of the intermediate distribution LM may be a voltage of 0 V or more rather than a negative voltage.

Figure 8A:
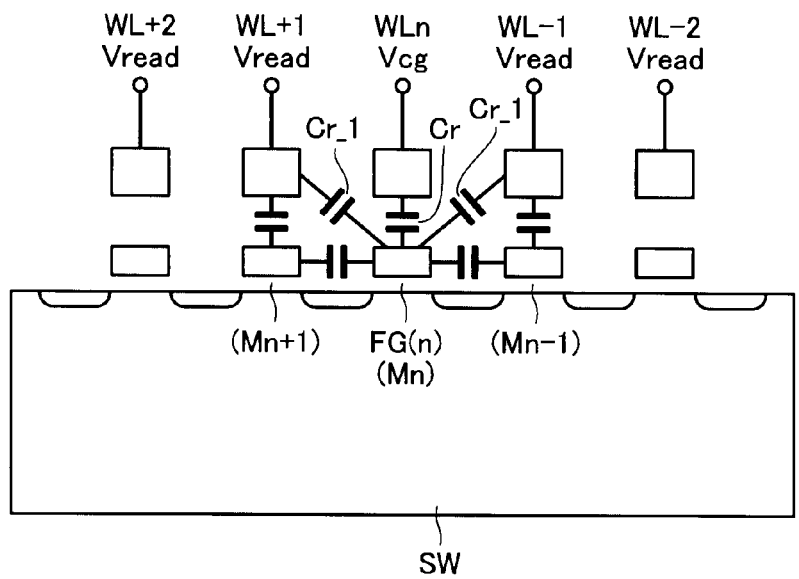
FIG. 8A shows an operation according to the first embodiment.

FIG. 8A shows, for the description of the principle of this embodiment, the relationship between the voltages applied to the respective portions of a selected NAND cell unit in the conventional read operation.

When the word-lines WLn−1 and WLn+1 adjacent to the selected word-line WLn are supplied with the read voltage Vread, the threshold voltage of the floating gate FG (n) of the memory cell Mn connected to the selected word-line WLn becomes substantially low. Here, it is defined that, for example, the capacitive coupling ratio between the word-line WLn of the selected memory cell Mn and the floating gate FG (n) of the selected memory cell Mn is Cr, and the capacitive coupling ratios between the word-lines WLn−1 and WLn+1 adjacent to the selected word-line WLn and the floating gate FG (n) of the selected memory cell Mn are each Cr_1. In this case, it is now assumed that to read data from the selected memory cell Mn, the word-line WLn of the selected memory cell Mn is applied with the predetermined read voltage Vcg, and to keep the unselected memory cells (Mn+1, Mn−1, and others) on-state regardless of their held data, the word-lines of the unselected memory cells are applied with the read-pass voltage Vread. In this case, the above capacitive coupling ratio Cr_1 increases the voltage of the floating gate FG (n) of the selected memory cell Mn. The threshold voltage of the selected memory cell Mn is thus substantially reduced.

This phenomenon becomes more significant as the memory cell becomes more compact, i.e., the capacitive coupling ratio Cr_1 increases. This is because the larger capacitive coupling ratio Cr_1 provides a substantially lower threshold voltage of the selected memory cell Mn, even if the floating gate FG (n) has the same number of electrons injected thereinto.

Figure 8B:
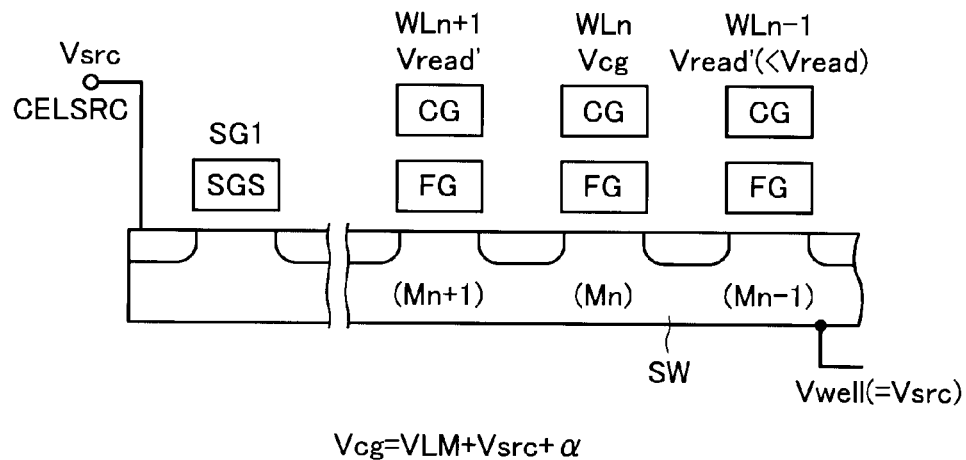
FIG. 8B shows an operation according to the first embodiment.

In this embodiment, therefore, referring to FIG. 8B, in the verify operation of the intermediate distribution LM, at least the unselected memory cells Mn+1 and Mn−1 adjacent to the selected memory cell Mn are applied with a read-pass voltage Vread'. The voltage Vread' is lower than the read-pass voltage Vread applied to the control gate of the unselected memory cell in the conventional read operation (the read operation after the writing of all threshold voltage distributions E and A to C is complete).

The voltage Vread' may be any voltage sufficiently higher than the upper limit VLMu of the intermediate distribution LM (for example, a voltage about 2 V higher than the assumed upper limit VLMu). It is thus also possible to set the read-pass voltage Vread' to a value lower than the upper limits of the threshold voltage distributions B and C. This is because, in the write procedure as shown in FIG. 2, when starting the writing with a memory cell nearer the source-line CELSRC, and then performing the writing sequentially from the memory cell nearer the source-line CELSRC to a memory cell nearer the bit-line BL, the memory cell Mn+1 adjacent to the selected memory cell Mn at the source-line side is written with the intermediate distribution LM. Specifically, when the selected memory cell Mn is written with the intermediate distribution LM, the memory cell Mn+1 is not written with the threshold voltage distribution B or C having a higher threshold voltage. This is because when the writing of the intermediate distribution LM into the selected memory cell Mn is complete, a memory cell having the threshold voltage distribution B or C having a higher threshold voltage is not included in the memory cells adjacent to the selected cell.

In other words, in the verify operation of the intermediate distribution LM, the verify operation being performed before the selected memory cell Mn is written with the maximum threshold voltage distribution C, the unselected memory cells Mn+1 and Mn−1 adjacent to the selected memory cell Mn are applied with the read-pass voltage Vread' lower than the normal read-pass voltage Vread.

By way of example, for the verify voltage assignment as shown in FIG. 6, the read-pass voltage Vread' may be 3.0 V, which is about 3V lower than the read-pass voltage Vread (6.0 V).

In this way, the verify operation of the intermediate distribution LM uses the read-pass voltage Vread', which is lower than the normal read-pass voltage Vread and is sufficiently higher than the upper limit VLMu of the intermediate distribution LM. When the word-lines WLn−1 and WLn+1 adjacent to the selected word-line WLn are applied with the Vread' lower than the read-pass voltage Vread, the threshold voltage of the selected memory cell Mn looks higher than that when applied with the read-pass voltage Vread. In the verify operation of the intermediate distribution LM, therefore, even if the verify voltage VLM for the intermediate distribution LM is set to, for example, −3 V as shown in FIG. 6 and the voltage of the source-line CELSRC and the voltage Vwell of the well SW are as low as, for example, 1.5 V, the voltage Vcg applied to the selected memory cell in the verify operation of the intermediate distribution LM needs not be a negative voltage and may be, for example, 0 V.

Figure 9:
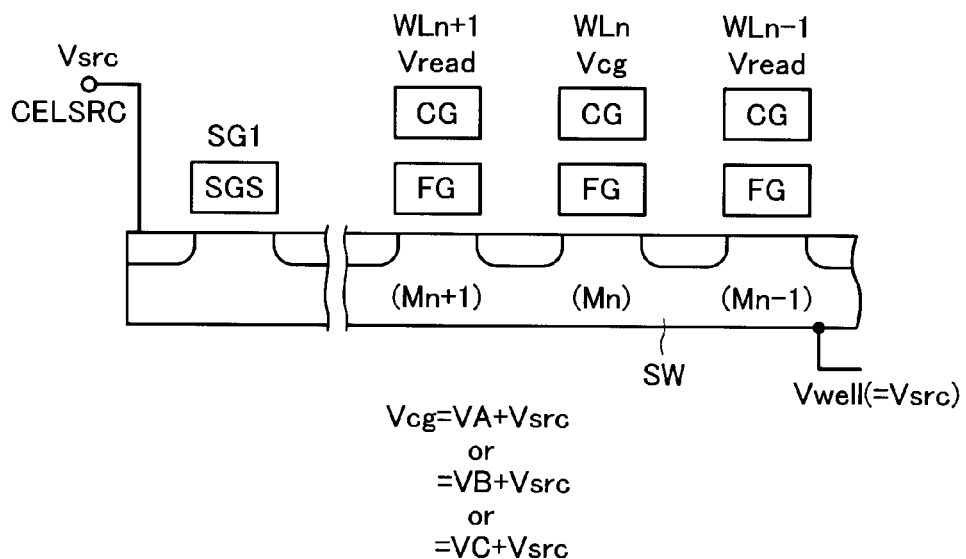
FIG. 9 shows an operation according to the first embodiment.

After the write operation of the intermediate distribution LM, the write operations of the threshold voltage distributions A, B, and C are further performed, and then the verify operations of the threshold voltage distributions A, B, and C are performed. In the verify operations, as shown in FIG. 9, the normal read-pass voltage Vread is applied to the unselected memory cell. Because the memory cell adjacent to the selected memory cell may be written with the threshold distribution C, the read-pass voltage Vread is set to a value sufficiently higher than the upper limit of the threshold voltage distribution C (that has the largest voltage level of the threshold voltage distributions). The read-pass voltage Vread is higher than the Vread'. In the verify operation of the intermediate distribution LM, therefore, even if the read-pass voltage Vread' is set lower than the read-pass voltage Vread, it will not adversely affect the verify voltages VA, VB, and VC. Even if the verify operation of the threshold voltage distributions A, B, and C and the read operation are performed in the negative sense scheme, the control gate of the selected memory cell needs not be provided with a negative voltage.

Thus, in this embodiment, in addition to the negative sense scheme performed, the read-pass voltage Vread' applied to the control gate of the unselected memory cell in the verify operation of the intermediate distribution LM is set lower than the normal read-pass voltage Vread (this may hereafter be referred to as "pseudo-negative sense scheme"). As the verify operation of the intermediate distribution LM is performed in the pseudo-negative sense scheme, the voltages Vsrc and Vwell applied to the respective source-line CELSRC and well SW may be small enough (for example 1.5 V or less) not to adversely affect the write operation speed, thereby improving the write speed. There is also no need to apply a negative voltage to the control gate of the selected memory cell for the verify operation of the intermediate distribution LM. The area of the peripheral circuit may thus be reduced.

In the verify operations and read operations of the threshold voltage distributions A, B, and C to which data is actually assigned, the word-lines WLn+1 and WLn−1 adjacent to the selected word-line WLn are applied with the normal read-pass voltage Vread. As a result, even if the memory cells Mn+1 and Mn−1 adjacent to the selected memory cell Mn are the memory cells having the threshold distribution C, the memory cell transistor may be turned on. In other words, the upper limit of the threshold distribution C may be higher than the Vread'. Specifically, by using the pseudo-negative sense scheme only in the verify operation of the intermediate distribution LM having a lower threshold voltage, the threshold voltage may be shown higher only for the intermediate distribution LM having a lower threshold voltage distribution. As a result, there is no need to apply a negative voltage to the control gate (word-line) of the selected memory cell Mn for the verify operation of the intermediate distribution LM. The area of the peripheral circuit may thus be reduced. As the entire intermediate distribution LM may be lowered, the distance between the upper limit of the intermediate distribution LM and the lower limit of the threshold distribution C having the largest voltage level can be increased, thereby increasing the distance between the lower limit of the threshold distribution C and the upper limit of the threshold distribution B.

Note that although the above example shows that the unselected memory cells Mn+1 and Mn−1 adjacent to the selected memory cell Mn are applied with the voltage Vread', an unselected memory cell other than the adjacent unselected memory cells Mn−1 and Mn+1 may be applied with the same voltage Vread'.

[Second Embodiment]

Figure 10B:
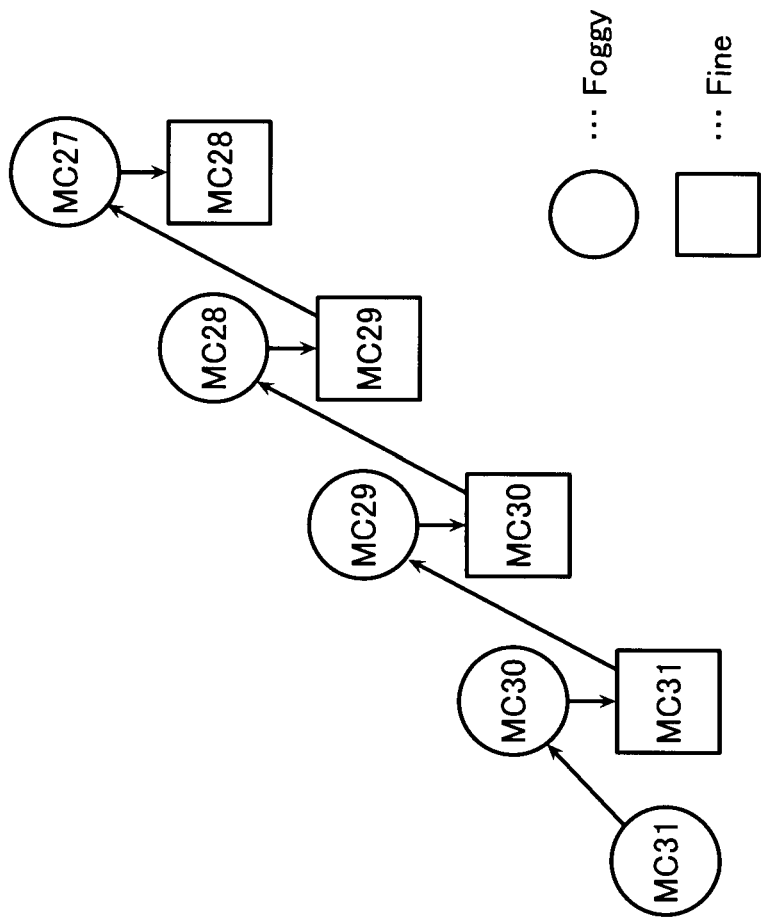
FIG. 10B shows an operation according to the second embodiment.

Referring now to FIGS. 10A and 10B, a second embodiment will be described. The first embodiment illustrates an example in which one intermediate distribution LM is written, and a verify operation of the one intermediate distribution LM is performed with the above read-pass voltage Vread'.

Figure 10B:
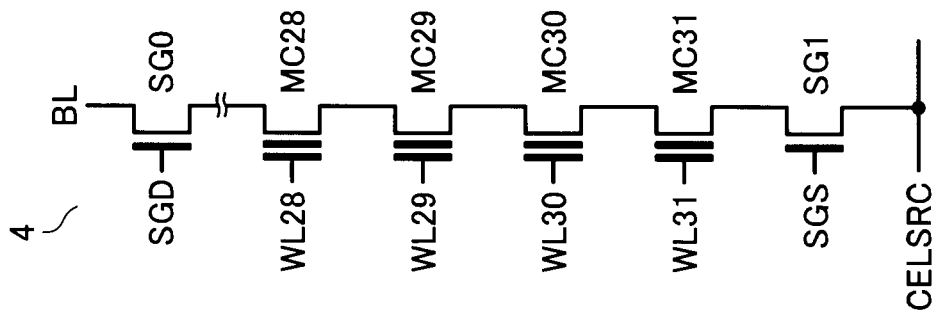

The second embodiment illustrates a scheme in which as shown in FIG. 10, three intermediate distributions FMA, FMB, and FMC are written (foggy write), and then the intermediate distributions FMA to FMC are used to write the final target threshold voltage distributions A, B, and C (fine write). In this scheme, the verify operations of the intermediate distributions FMA, FMB, and FMC are performed in the above pseudo-negative sense scheme.

The foggy write is a rough write of the upper page data/lower page data. The fine write is an accurate write of the upper page data/lower page data. Specifically, the foggy write operation and the fine write operation are performed as a two-stage write operation.

Referring to FIG. 10A, a write operation in a four-level storage scheme including the foggy write operation and the fine write operation will be described. First, starting with the state (1) in which all memory cells are erased, the foggy write operation to a memory cell MCn (2) is performed. Referring to FIG. 10A, the foggy write operation is a write operation in which a verify voltage VAV', VBV', or VCV' smaller than the lower limits of the final target threshold voltage distributions E, A, B, and C is used to obtain the intermediate distribution FMA, FMB, or FMC.

The fine write operation to the memory cell MCn (3) is then performed. The fine write operation uses the verify voltage VAV, VBV, or VCV equal to the lower limits of the final target threshold voltage distributions E, A, B, and C to shift the intermediate distribution FMA, FMB, or FMC in the positive direction to obtain the threshold voltage distribution E, A, B, or C. Specifically, the verify voltages VAV', VBV', and VCV' for the foggy write are lower than the respective verify voltages VAV, VBV, and VCV for the fine write. Likewise, the lower limits of the intermediate distributions FMA, FMB, and FMC are smaller than the lower limits of the respective threshold voltage distributions A, B, and C. Note that the upper limits of the intermediate distributions FMA, FMB, and FMC may be higher than the upper limits of the respective threshold voltage distributions A, B, and C.

The intermediate distributions FMA, FMB, and FMC are written before the threshold voltage distributions A, B, and C are written, and are not assigned with the final data. Specifically, the memory cell reading is set to read voltages RA, RB, and RC that fall between the upper and lower limits of two of the threshold voltage distributions E and A to C.

In this embodiment, like the first embodiment, in the verify operation of the intermediate distributions FMA, FMB, and FMC, at least the word-lines WLn+1 and WLn−1 of the unselected memory cells Mn+1 and Mn−1 adjacent to the selected memory cell Mn are applied with the read-pass voltage VreadC'. The voltage VreadC' is lower than the read-pass voltage Vread applied to the control gate of the unselected memory cell in the normal read operation (the read operation after the writing of all threshold voltage distributions E and A to C is complete).

Each read-pass voltage VreadC' may be any voltage sufficiently higher than the upper limits of the intermediate distributions FMA, FMB, and FMC (for example, a voltage about 2 V higher than the assumed upper limit).

This is because, for example, in the foggy write and the fine write performed in the order as shown in FIG. 10B, at the verify operation of the foggy write to the selected memory cell, a threshold voltage distribution of the memory cell adjacent to the selected memory cell d is not higher than the upper limit of the intermediate distribution FMC.

The order of the foggy write and the fine write as shown in FIG. 10B is described below. In general, in the NAND cell flash memory and in one NAND string, the memory cell MC31 nearer the common source-line CELSRC is written first, the other memory cells are then written sequentially, and the farthest memory cell MC1 is written finally.

In the above foggy write operation and the fine write operation in the NAND string, the write procedure as shown in FIG. 10B may minimize the variation of the threshold voltage distribution. First, the foggy write is performed to the memory cell MC31 nearest the common source-line CELSRC. The foggy write is then performed to the adjacent memory cell MC30, and then back to the memory cell MC31 and the fine write is performed to the memory cell MC31.

At the next step, the foggy write is performed to the memory cell MC29 two cells away from the memory cell MC31 in the bit-line BL direction, not the memory cell MC30 adjacent to the memory cell MC31. The variation of the threshold voltage distribution of the memory cell MC31 is thus controlled. The fine write is then performed to the memory cell MC30. Although the foggy write to the memory cell MC29 should vary the threshold voltage distribution of the memory cell MC30 after the foggy write, the fine write may eliminate the variation.

Afterwards, after the fine write is completed to the memory cell MCn, the foggy write is performed to the memory cell MCn−2 (two cells away from the cell MCn in the bit-line BL direction), and then back by one cell to the memory cell MCn−1 and the fine write performed. This procedure is continued until the memory cell MC1. The memory cell array undergoing the foggy/fine write may thus minimize the adverse affect from the adjacent memory cell.

Thus, in this embodiment, the foggy write/fine write scheme as shown in FIGS. 10A and 10B may incorporate the negative sense scheme, and the verify operation of the intermediate distributions FMA to FMC may utilize the above pseudo-negative sense scheme. This is because at the verify operation of the foggy write to the selected memory cell MCn, the memory cell adjacent to the selected memory cell MCn does not include a memory cell having a threshold voltage distribution higher than the upper limit of the intermediate distribution FMC. Specifically, even the read-pass voltage VreadC' lower than the normal read-pass voltage Vread may turn on the memory cell transistor having the unselected memory cell Mn+1 or Mn−1 as the gate electrode.

At the verify operation of the fine write to the selected memory cell MCn, the memory cell adjacent to the selected memory cell MCn includes a memory cell having the threshold voltage distribution C. The pass voltage Vread is thus used to turn on a memory cell transistor having the unselected memory cell Mn+1 or Mn−1 as the gate electrode.

It is now assumed that the lower limit of the threshold voltage distribution A is a negative value. Then, the lower limit of the intermediate distribution FMA having a threshold distribution voltage totally lower than that of the threshold voltage distribution A is also a negative value. In this case, the verify operation of the foggy write utilizes the pseudo-negative sense scheme, and the verify operation of the fine write utilizes the negative sense scheme.

Thus, in the foggy write, in the verify operation of the selected memory cell MCn provided with a threshold voltage corresponding to the intermediate distribution FMA, even if the lower limit of the intermediate distribution FMA is a voltage (for example, −3.0 V) that will adversely affect the operation speed if the voltage is applied to the well, the verify operation of the intermediate distribution FMA may be performed with a non-negative read voltage applied to the selected memory cell. Additionally, in the fine write, in the verify operation of the selected memory cell MCn provided with a threshold voltage corresponding to the threshold voltage distribution A, the negative sense scheme may be used.

Note that even if the lower limit of the threshold voltage distribution A is a negative value, the negative sense scheme may allow for the verify operation of the threshold voltage distribution A by applying a positive voltage to the control gate of the selected memory cell. As a result, the circuit configuration may be simplified.

The lower limit of the intermediate distribution FMA is decreased by the pseudo-negative sense scheme can decrease. As a result, the lower limit of the threshold voltage distribution A assigned as data may also be decreased, and accordingly, the upper limit of the threshold voltage distribution C higher than the threshold distribution voltage A may also be decreased. As a result, the stress on the memory cell may be reduced in the writing of the threshold voltage distribution C, thereby improving the memory cell reliability.

[Third Embodiment]

Figure 11:
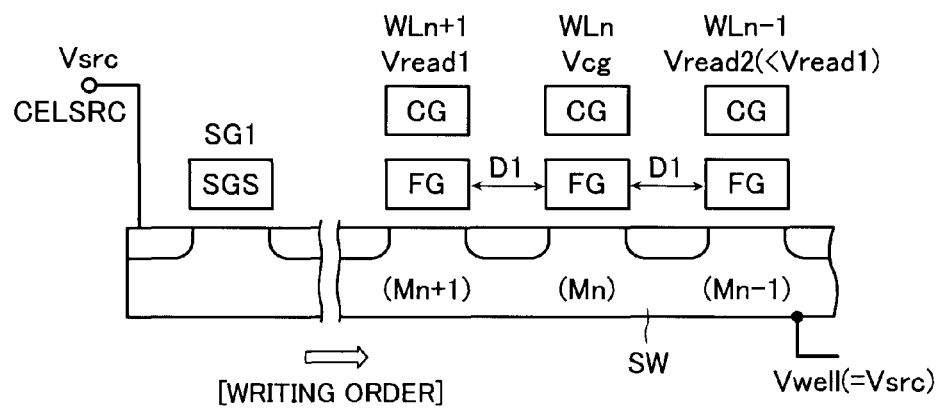
FIG. 11 shows an operation according to a third embodiment.

Referring now to FIG. 11, a third embodiment will be described.

In the third embodiment, the basic configuration of the circuit is the same as that in the first embodiment (FIG. 1). The basic write procedure is the same as those shown in FIGS. 2, 3, 10A, and 10B. Specifically, the negative sense scheme is utilized, and in the verify operation of the intermediate distribution LM or FMA to FMC, the read-pass voltage applied to the unselected memory cells Mn+1 and Mn−1 is lower than the normal read-pass voltage Vread, as in the first embodiment.

Note, however, that this embodiment is different from the first embodiment in that, as shown in FIG. 11, the unselected memory cell Mn+1 is applied with a read-pass voltage Vread1 lower than the read-pass voltage Vread, while the unselected memory cell Mn−1 is applied with a read-pass voltage Vread2 even lower than the read-pass voltage Vread1.

In the NAND cell flash memory, usually, to avoid the variation of the threshold voltage of the written memory cell, the writing is started with a memory cell nearer the source-line CELSRC and then is performed sequentially from the memory cell nearer the source-line CELSRC to a memory cell nearer the bit-line BL (note that in the first embodiment, the memory cell MC31 is first written, and then the memory cells M30, M29, . . . , and M1 are written). In the write procedure, in the write operation of the intermediate distribution LM and FMA to FMC, the memory cell Mn+1 is written before the memory cell Mn−1, and the memory cell Mn+1 may have a higher threshold voltage than the memory cell Mn−1.

In this embodiment, therefore, the unselected memory cell Mn+1 having a higher threshold voltage is applied with a read-pass voltage Vread1, while the unselected memory Mn−1 is applied with a read-pass voltage Vread2 lower than the voltage Vread1. Specifically, this is because the memory cell having a lower threshold voltage has fewer electrons injected thereinto, so that there is no need for the application of a high voltage to obtain the advantage of decreasing the threshold voltage of the selected cell. This embodiment may further improve the advantages described in the first and second embodiments.

Note that it may be more effective to use the threshold voltage (held data) of the unselected memory cell Mn+1 to change the read-pass voltage applied to the word-line WLn+1. For example, if the memory cell Mn+1 has a threshold voltage corresponding to the threshold voltage distribution E, it is preferable to apply the read-pass voltage Vread2 to the word-line WLn+1 in addition to the word-line WLn−1.

[Fourth Embodiment]

Figure 12:
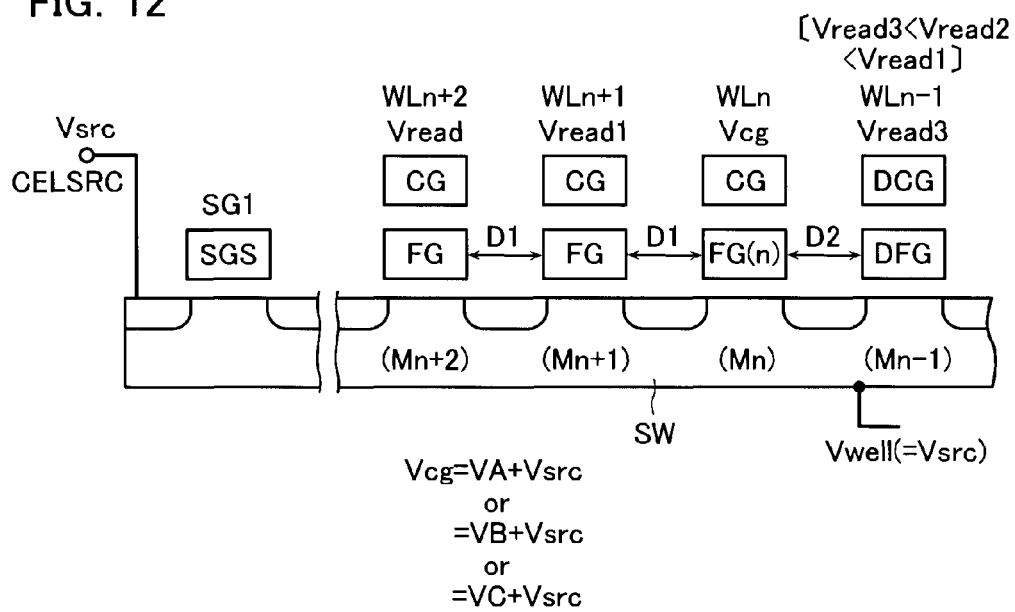
FIG. 12 shows an operation according to a fourth embodiment.

Referring now to FIG. 12, a fourth embodiment will be described.

As shown in FIG. 12, the fourth embodiment is applicable to word-lines WL having different distances therebetween. For example, this embodiment holds when the memory cells Mn+2 to Mn have an array pitch of D1 therebetween, and the memory cells Mn and Mn−1 have a pitch of D2 (>D1) therebetween. Such an array may be used at the end portion of the memory cell.

In the NAND cell flash memory, if, for example, the memory cell Mn is selected and subjected to the write operation and the verify operation, the word-line WLn−1 of the adjacent memory cell Mn−1 is applied with a read-pass voltage Vread3 even lower than the above read-pass voltage Vread2 (Vread3<Vread2). This is because the memory cell Mn−1 is arranged in the array pitch D2 larger than the normal array pitch D1. Specifically, this is because the capacitive coupling ratio between the word-line WLn−1 of the memory cell Mn−1 adjacent to the selected memory cell Mn and the floating gate FG (n) of the selected memory cell Mn is smaller than the capacitive coupling ratio between the word-line WLn+1 of the memory cell Mn+1 adjacent to the selected memory cell Mn and the floating gate FG (n) of the selected memory cell Mn. Specifically, an influence of the voltage applied to the word-line WLn−1 on the floating gate FG (n) is less than an influence of the voltage applied to the word-line WLn+1 on the floating gate FG (n). Specifically, the voltage Vread3 applied to the word-line WLn−1 is preferably is lower than the read-pass voltage Vread1 applied to the word-line WLn+1.

Thus, the low read-pass voltage Vread3 applied may provide, even if the memory cells have different array pitches therebetween, an advantage similar to those in the above first to third embodiments.

[Fifth Embodiment]

Figure 13:
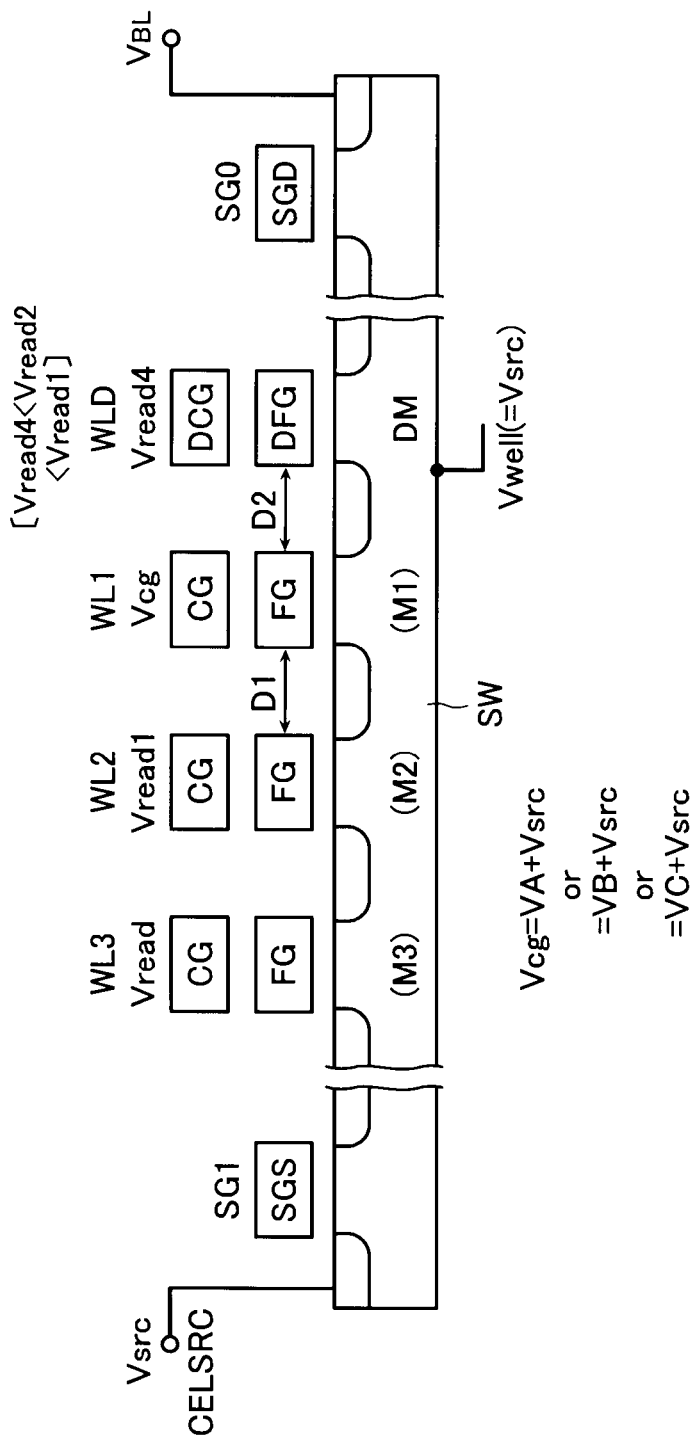
FIG. 13 shows an operation according to a fifth embodiment.

Referring now to FIG. 13, a fifth embodiment will be described.

As shown in FIG. 13, the fifth embodiment is different from the above embodiments in that the memory cells at the end portions of the memory string (the memory cells adjacent to the select gate lines SGD and SGS) are dummy cells DM not for stored the data. It is assumed that the dummy cells DM are formed with different array pitches from those of the other memory cells. By way of example, if the normal memory cells M have an array pitch of D1 therebetween, the dummy cell DM and the memory cell M1 have a pitch D2 (>D1) therebetween.

In the NAND cell flash memory having the dummy cells DM, if, for example, the memory cell M1 adjacent to the dummy cell DM is selected and subjected to the write operation and the verify operation, the dummy cell DM is applied with a read-pass voltage Vread4 even lower than the above read-pass voltage Vread2 (Vread4<Vread2). This is because the dummy cells DM are arranged with an array pitch D2 larger than the normal array pitch D1, and are usually controlled to have a low threshold voltage such as the erase distribution E. Specifically, this is because the memory cell having a lower threshold has fewer electrons injected thereinto, so that there is no need for the application of a high voltage to obtain the advantage of decreasing the threshold voltage of the selected cell.

Thus, the low read-pass voltage Vread4 applied may provide an effect similar to those in the above third to fourth embodiments.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 14:
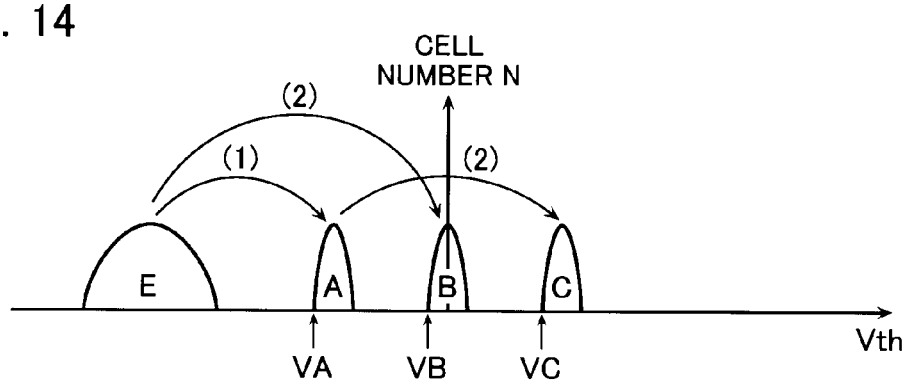
FIG. 14 illustrates a modified example.

Further, the present invention is applicable not only to a device having a write operation of the intermediate distribution LM. For example, referring to FIG. 14, a device may be assumed in which without writing the intermediate distribution LM, the write operation (the operation (1)) from the erase distribution E to the threshold voltage distribution A is performed with the negative verify voltage VA (the operation (1)), and then the write operation from the erase distribution E to the threshold voltage distribution B or the write operation from the threshold voltage distribution A to the threshold voltage distribution C is performed (the operation (2)). The present invention is applicable to such a device with respect to the verify operation of the threshold voltage distribution A. Specifically, the present invention is applicable to any verify operation before the write operation of the maximum threshold voltage distribution of a plurality of threshold voltage distributions.

Although the above embodiments have been described with respect only to the four-level storage scheme (two bits/cell) device, it will be appreciated that the present invention is also applicable to a device that stores three or more bits in one memory cell.

What is claimed is:

1. A volatile semiconductor memory device comprising:
   a semiconductor layer;
   a memory cell array comprising a memory string, the memory string comprising a plurality of memory cells connected in series;
   a bit-line electrically connected to a first end of the memory string;
   a source-line electrically connected to a second end of the memory string; and
   a control circuit configured to control voltages applied to the semiconductor layer, control gates of the memory cells, the bit-line, and the source-line,
   the control circuit being configured to perform, in a write operation to the memory cell and a verify operation for verifying threshold voltage of the memory cell, a voltage control to provide the memory cell with a plurality of threshold voltage distributions,
   the control circuit being configured to apply, in a read operation from the memory cell, to a selected memory cell a read voltage between the lower and upper limits of the threshold voltage distributions, and apply to an unselected memory cell a first read-pass voltage higher than the upper limit of a first threshold voltage distribution, the first threshold voltage distribution being the maximum distribution of the threshold voltage distributions, and
   the control circuit being configured to apply, at least during a verify operation in a first write operation conducted before a second write operation that completes writing to the first threshold voltage distribution, a second read-pass voltage lower than the first read-pass voltage to the unselected memory cell, and apply to the semiconductor layer and the source-line a positive voltage.

2. The non-volatile semiconductor memory device according to claim 1, wherein
   the first write operation is an operation of providing a second threshold voltage distribution having a lower limit lower than the lower limit of the first threshold voltage distribution.

3. The non-volatile semiconductor memory device according to claim 1, wherein
   the control circuit is configured to apply, in the read operation from the memory cell, to the semiconductor layer and the source-line a positive voltage.

4. The non-volatile semiconductor memory device according to claim 1, wherein
   the control circuit is configured to perform the write operation to the memory cells in the memory string such that the write operation is started with a memory cell nearer the source line, and then is performed sequentially in order of the distance from the source line, and
   in the verify operation of the selected memory cell, an unselected memory cell adjacent to the selected memory cell on the source-line side thereof is applied with a first voltage as the second read-pass voltage, and an unselected memory cell adjacent to the selected memory cell on the bit-line side thereof is applied with a second voltage lower than the first voltage as the second read-pass voltage.

5. The non-volatile semiconductor memory device according to claim 4, wherein
   the memory string has an end portion connected to a dummy cell, and in the verify operation of a memory cell adjacent to the dummy cell, the dummy cell is applied with a third voltage lower than the second voltage as the second read-pass voltage.

6. The non-volatile semiconductor memory device according to claim 4, wherein
for a first memory cell disposed at a first pitch from the selected memory cell on the bit-line side thereof, in a verify operation of the selected memory cell, the first memory cell is applied with a fourth voltage, and
for a second memory cell disposed at a second pitch longer than the first pitch from the selected memory cell on the bit-line side thereof, in a verify operation of the selected memory cell, the second memory cell is applied with a fifth voltage lower than the fourth voltage.

7. The non-volatile semiconductor memory device according to claim 2, wherein
the second threshold voltage distribution is an intermediate distribution different from any of the threshold voltage distributions to be subjected to the read operation.

8. The non-volatile semiconductor memory device according to claim 2, wherein
the second threshold voltage distribution is changed to the first threshold voltage distribution or held as the second threshold voltage distribution by the write operation, and is subjected to the read operation.

9. The non-volatile semiconductor memory device according to claim 2, wherein
the control circuit is configured to perform, when the write operation of the first threshold voltage distribution to a first memory cell is completed, a write operation of the second threshold voltage distribution to a second memory cell two cells away from the first memory cell in the bit-line direction, and then perform, when the write operation of the second threshold voltage distribution to a third memory cell adjacent to the first memory cell in the bit-line direction is completed, a write operation of the first threshold voltage distribution to the second memory cell.

10. A method of reading data from a non-volatile semiconductor memory device comprising a memory cell array,
the memory cell array comprising:
a semiconductor layer;
a memory string comprising a plurality of memory cells connected in series;
a bit-line electrically connected to a first end of the memory string; and
a source-line electrically connected to a second end of the memory string,
the method comprising:
in a read operation from the memory cell, applying to a selected memory cell a read voltage between the lower and upper limits of a plurality of threshold voltage distributions, and applying to an unselected memory cell a first read-pass voltage higher than the upper limit of a first threshold voltage distribution, the first threshold voltage distribution being the maximum distribution of the threshold voltage distributions, and
at least during a verify operation in a first write operation conducted before a second write operation that completes writing to the first threshold voltage distribution, applying a second read-pass voltage lower than the first read-pass voltage to the unselected memory cell, and applying to the semiconductor layer and the source-line a positive voltage.

11. The method of reading data from a non-volatile semiconductor memory device according to claim 10, wherein
the first write operation is an operation of providing a second threshold voltage distribution having a lower limit lower than the lower limit of the first threshold voltage distribution.

12. The method of reading data from a non-volatile semiconductor memory device according to claim 10, wherein
in the read operation from the memory cell, the semiconductor layer and the source-line are applied with a positive voltage.

13. The method of reading data from a non-volatile semiconductor memory device according to claim 10, wherein
the write operation to the memory cells in the memory string is started with a memory cell nearer the source line, and then is performed sequentially in order of the distance from the source line, and
in the verify operation of the selected memory cell, an unselected memory cell adjacent to the selected memory cell on the source-line side thereof is applied with a first voltage as the second read-pass voltage, and an unselected memory cell adjacent to the selected memory cell on the bit-line side thereof is applied with a second voltage lower than the first voltage as the second read-pass voltage.

14. The method of reading data from a non-volatile semiconductor memory device according to claim 13, wherein
the memory string has an end portion connected to a dummy cell, and
in the verify operation of a memory cell adjacent to the dummy cell, the dummy cell is applied with a third voltage lower than the second voltage as the second read-pass voltage.

15. A semiconductor device comprising a control circuit for controlling a voltage applied to a memory cell array,
the memory cell array comprising:
a semiconductor layer;
a memory string comprising a plurality of memory cells connected in series;
a bit-line electrically connected to a first end of the memory string; and
a source-line electrically connected to a second end of the memory string,
the control circuit being configured to perform, in a first write operation to the memory cell, a first verify operation for verifying a threshold voltage of the memory cell after the first write operation, a second write operation to the memory cell, and a second verify operation for verifying threshold voltage of the memory cell after the second write operation, a voltage control to provide the memory cell with a plurality of threshold voltage distributions,
the control circuit being configured to apply, in the second verify operation, to a selected memory cell a read voltage between the lower and upper limits of the threshold voltage distributions, and apply to an unselected memory cell a first read-pass voltage higher than the upper limit of a first threshold voltage distribution, the first threshold voltage distribution being the maximum distribution of the threshold voltage distributions, and
the control circuit being configured to apply, in the first verify operation after the first write operation conducted before the second write operation, a second read-pass voltage lower than the first read-pass voltage to the unselected memory cell, and apply to the semiconductor layer and the source-line a positive voltage.

16. The non-volatile semiconductor memory device according to claim 15, wherein the control circuit being configured to perform the first write operation to form a second threshold voltage distribution, the control circuit being configured to perform the second write operation to shift the second threshold voltage distribution in a positive direction to form the first threshold voltage distribution.

17. The non-volatile semiconductor memory device according to claim 15, wherein the control circuit being configured to perform the first write operation to form a second threshold voltage distribution adjacent to a minimum distribution of the threshold voltage distributions, a lower limit of the second threshold voltage distribution has a negative value.

18. The non-volatile semiconductor memory device according to claim 15, wherein the control circuit being configured to apply, in the first verify operation, the second read-pass voltage to a memory cell adjacent to the selected memory cell, and the control circuit being configured to apply, in the second verify operation, the first read-pass voltage to a memory cell adjacent to the selected memory cell.

* * * * *